(12) United States Patent
Wu

(10) Patent No.: US 7,721,247 B2
(45) Date of Patent: May 18, 2010

(54) SIDE LOBE IMAGE SEARCHING METHOD IN LITHOGRAPHY

(75) Inventor: Tzong-Hsien Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 343 days.

(21) Appl. No.: 11/647,068

(22) Filed: Dec. 28, 2006

(65) Prior Publication Data
US 2008/0163154 A1 Jul. 3, 2008

(51) Int. Cl.
*G06F 17/50* (2006.01)
(52) U.S. Cl. .............................. 716/21; 716/19; 716/20
(58) Field of Classification Search .............. 716/19–21
See application file for complete search history.

(56) References Cited
U.S. PATENT DOCUMENTS

| | | | |
|---|---|---|---|
| 6,214,497 B1* | 4/2001 | Stanton | 430/5 |
| 6,401,236 B1* | 6/2002 | Baggenstoss et al. | 716/19 |
| 6,413,684 B1* | 7/2002 | Stanton | 430/5 |
| 7,252,913 B2* | 8/2007 | Kochan et al. | 430/30 |
| 7,376,930 B2* | 5/2008 | Wampler et al. | 716/19 |
| 2006/0138411 A1* | 6/2006 | Lachenmann et al. | 257/48 |
| 2006/0172204 A1* | 8/2006 | Peng et al. | 430/5 |
| 2006/0228041 A1* | 10/2006 | Joshi | 382/260 |

OTHER PUBLICATIONS

Wassenaar, J., "(Simple) polygon", Apr. 6, 2006, http://www.2dcurves.com/line/linep.html., obtained Jan. 29, 2009. pp. 1-2.*
Toublan et al., Fully Automatic Side Lobe Detection and Correction Technique for Attenuated Phase Shift Masks, Deep Submicron Technical Publication, (Apr. 2001).

* cited by examiner

*Primary Examiner*—Stacy A Whitmore
(74) *Attorney, Agent, or Firm*—Jianq Chyun IP Office

(57) ABSTRACT

A method for detecting the presence of side lobes in a full chip layout having a main pattern designed on a mask includes surrounding the main pattern with a pattern of polygons or circles. A lithography rule check is performed and uses the pattern of polygons or circles to search the main pattern for side lobes. The location of a side lobe is preferably marked with an error flag.

6 Claims, 7 Drawing Sheets

SIDE LOBE IMAGE SEARCHING METHOD IN LITHOGRAPHY

BACKGROUND OF THE INVENTION

The present invention relates generally to the lithography process of semiconductor chips, and more particularly, to detection of undesired error patterns during the lithography process.

Attenuated phase shift masks (PSM) are often used in the lithography process for semiconductor chip layouts. A PSM is manufactured to create a pattern on a photoresist layer deposited on the chip. Typically, bright and background areas are formed on the resist layer as light is passed through the mask. The material and structure of the mask employs interference of the light, by instituting phase differences, to imprint these images.

Unfortunately, a side effect of this process is the development of "side lobes". These side lobes are usually found near a transition zone from a bright area to a background area. Constructive interference in these zones leaves unintended energy patterns which remain on the resist layer following completion of the exposure. In the subsequent manufacturing process, the side lobes produce unwanted structures on the chip, which may be harmful depending on the size and the layout density of the chip. The side lobes are particularly harmful in contact arrays. As a result, side lobes hidden in full chip layouts can be a yield killer.

In the past, side lobe detection was a meticulous process. Areas with high probability of side lobe formation were examined manually in a simulation. Chrome spots were placed where the side lobes were expected to print, blocking the background light during the exposure. This process has become increasingly more difficult as wafers have decreased greatly in size, and denser, more complex layouts have become common.

More recently, computer software programs are being employed to ease the burden. Full chip aerial images can be generated for use. The program searches the entire chip layout, not just the areas of high probability. Though this eliminates the tedious manual work, a full chip simulation still requires a significant amount of time to complete. The technology is also very expensive.

It is therefore desirable to use a method of detecting side lobes which reduces the time expenditure and eliminates the need for extra investment in software.

BRIEF SUMMARY OF THE INVENTION

Briefly stated, an embodiment of the present invention includes a method for detecting the presence of side lobes in a full chip layout having a main pattern. The method requires the main pattern to be surrounded by a pattern of polygons. A lithography rule check is performed and uses the pattern of polygons to search the main pattern for side lobes. The location of side lobes are preferably marked with an error flag.

Another embodiment of the present invention includes a method for detecting the presence of side lobes in a full chip layout having a main pattern. The method requires the main pattern to be surrounded by a pattern of circles. A lithography rule check is performed and uses the pattern of circles to search the main pattern for side lobes. The location of side lobes are preferably marked with an error flag.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

DETAILED DESCRIPTION OF THE INVENTION

Figure 1A:
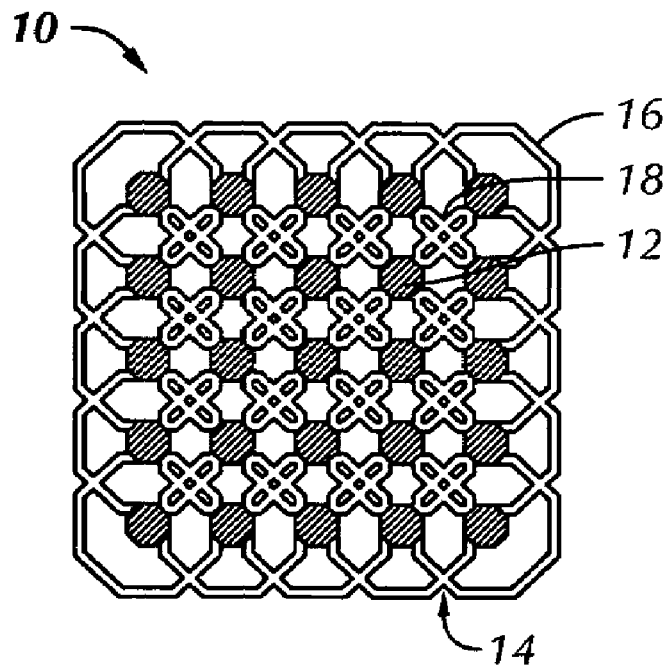
FIGS. 1A-1C show several partial chip layouts utilizing a preferred embodiment of the present invention to detect side lobes.
Figure 1B:
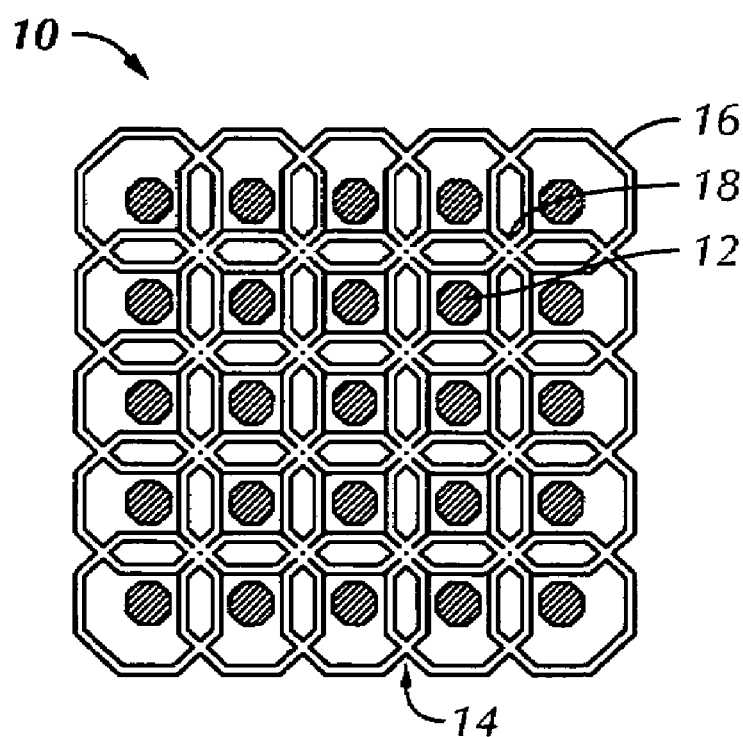
Figure 1C:
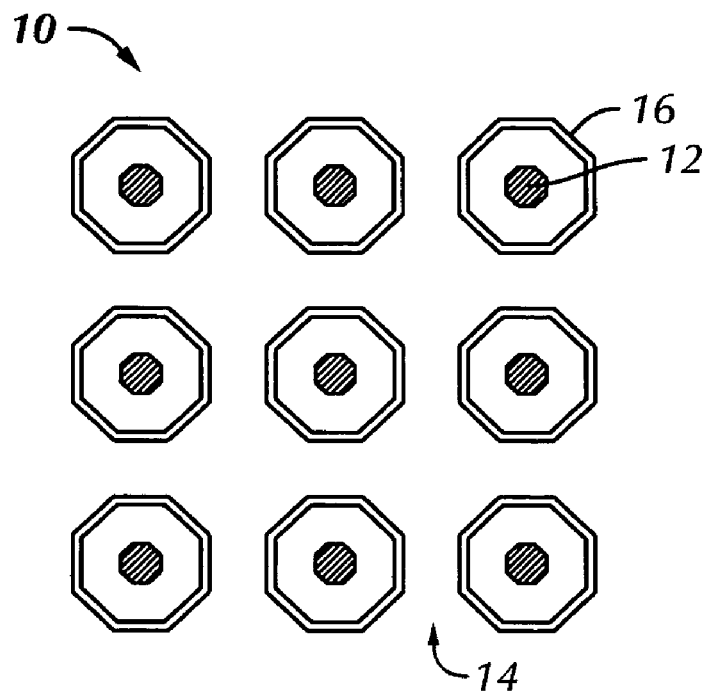

FIGS. 1A-1C show several partial chip layouts utilizing one preferred embodiment of the present invention to detect side lobes. Referring first to FIG. 1A, the main chip pattern, generally designated 10, is an array of contacts 12. The array pattern 10 is surrounded by a pattern of polygons, generally designated 14. In this preferred embodiment, the polygons used in the method are octagons. Each individual octagon 16 encloses one contact 12 in the array 10, but also borders on the edge of neighboring contacts 12, up to four. An individual octagon 16 also intersects with as many as eight neighboring octagons 16. The intersections 18 create up to four crossing patterns abutting respective corners of the enclosed contact 12.

In FIG. 1B, a less dense contact array 10, featuring smaller contacts 12, is shown. The octagon 16 may also be referred to as a side lobe radius or side lobe frame. In FIG. 1B, the side lobe radius 16 does not intersect with side lobe radii 16 diagonally neighboring it, and does not border on any other contact 12. In FIG. 1B, the sloped sides of diagonally neighboring side lobe radii 16 are merely in contact with one another. There are still formed at these junctures up to four crossing patterns 18, though the patterns 18 no longer abut the enclosed contact 12. As indicated, it is at the intersection of side lobe radii 16 where side lobes (not shown) may appear.

FIG. 1C shows an even less dense main pattern 10 with still smaller contacts. The side lobe radii 16 are no longer intersecting and are isolated from each other. The combined main pattern 10 and octagon pattern 14 of each of FIGS. 1A-1C may be entered into a lithography rule check (LRC) program. With the assistance of the side lobe radii 16, the LRC may detect where side lobes appear along the radii 16.

Figure 2:
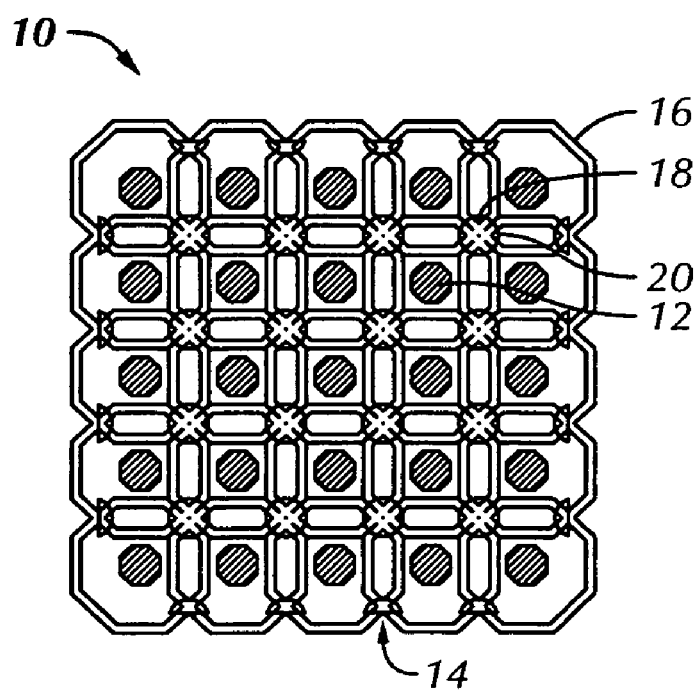
FIG. 2 shows the results from use of a preferred embodiment of the present invention.

FIG. 2 illustrates the results of the LRC run with assistance of the octagon pattern 14. The LRC found side lobes 20 at the side lobe radii intersections 18 as discussed in FIGS. 1A-1C. By placing the side lobe radii 16 around the main pattern 10 and using the LRC, the highest risk areas for side lobe development are covered and searched. It is no longer necessary to do a scan of the entire chip layout, and the process window is thereby improved.

Figure 3A:
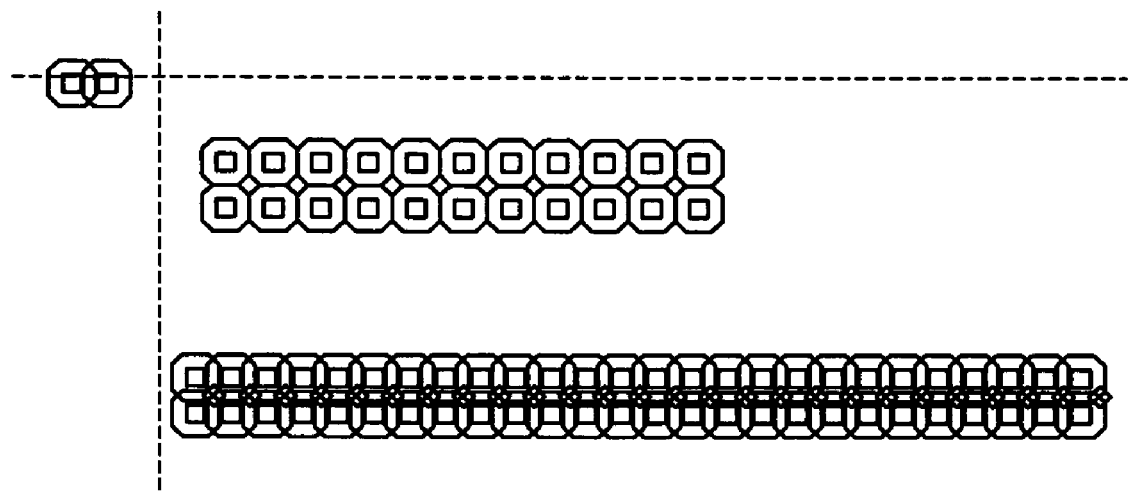
FIG. 3A shows the use of a preferred embodiment of the present invention on an actual chip layout.
Figure 3B:
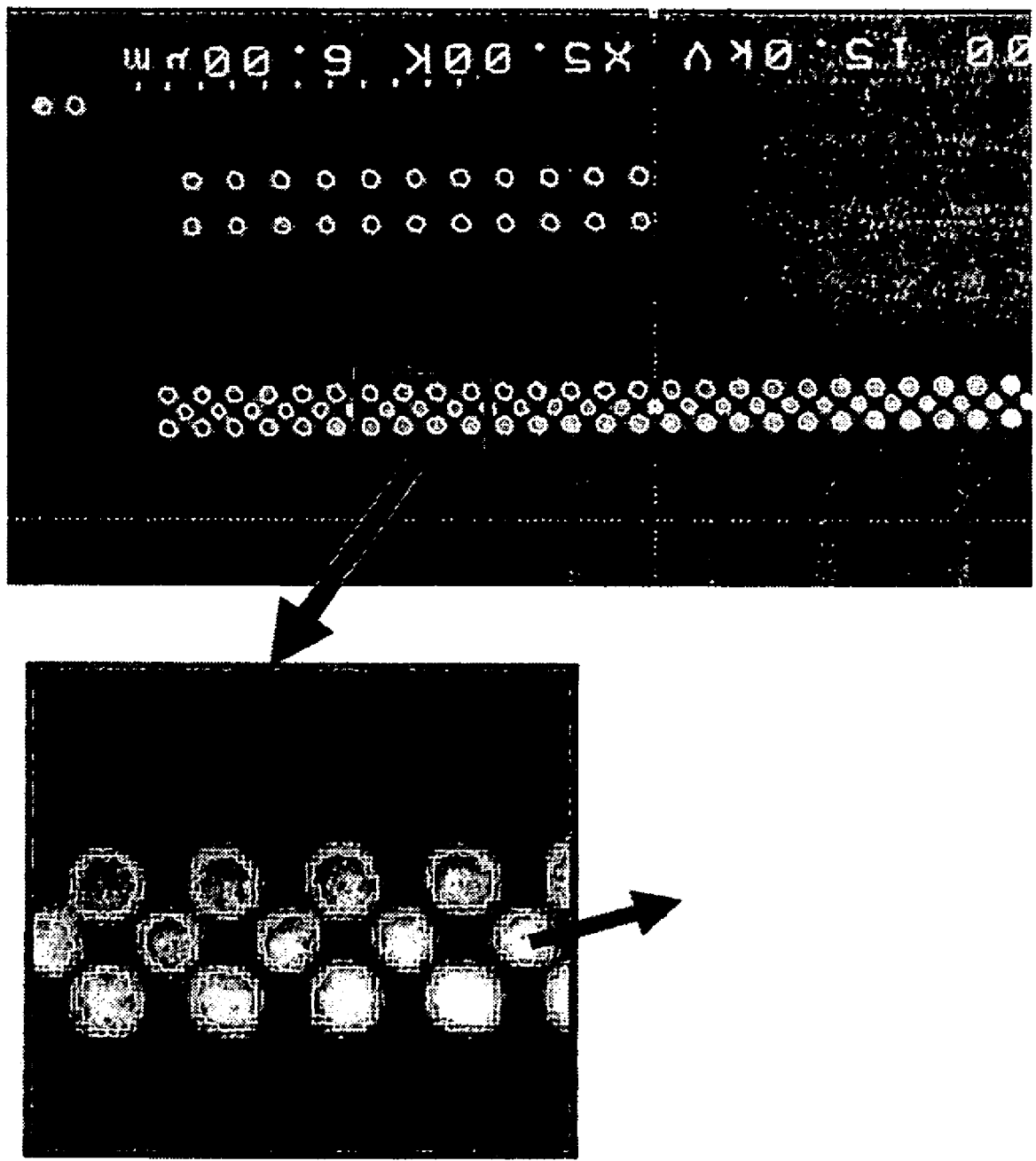
FIG. 3B shows actual images of results from the use of a preferred embodiment of the present invention as shown in FIG. 3A.

FIG. 3B shows the actual results of a side lobe check on a portion of a chip 5175 VIA. The method of surrounding the main pattern with a pattern of octagons, as seen in FIG. 3A, and running the LRC was used. No side lobes were found in the top two contact configurations. This is not surprising given the low density. In the bottom contact configuration featuring two rows however, side lobes were found at each intersection of four side lobe radii. The side lobes are nearly equivalent in size to the intended contacts and are nearly as numerous. Producing a wafer with this configuration might have been disastrous.

Figure 4A:
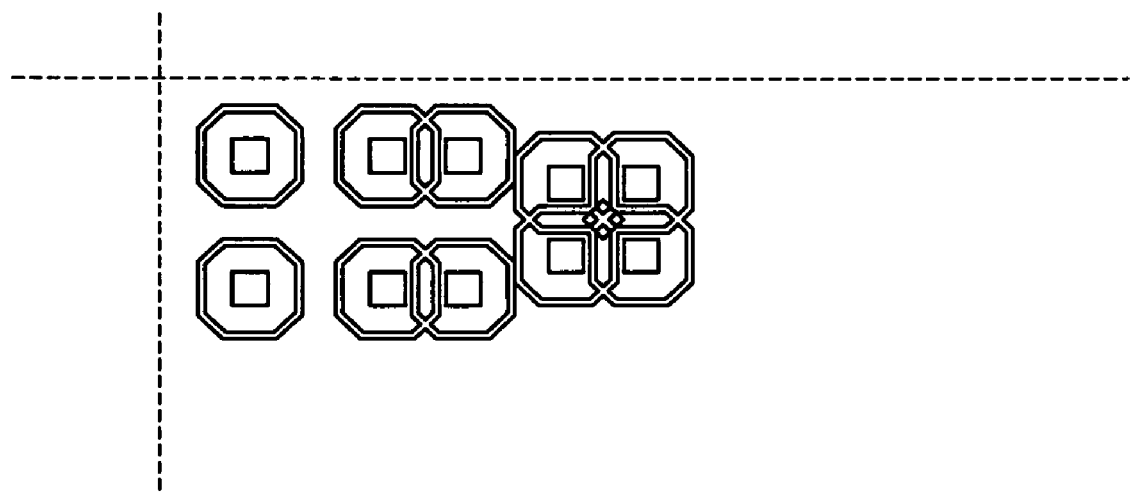
FIG. 4 shows additional side lobe cases found in the actual chip through use of a preferred embodiment of the present invention.
Figure 4B:
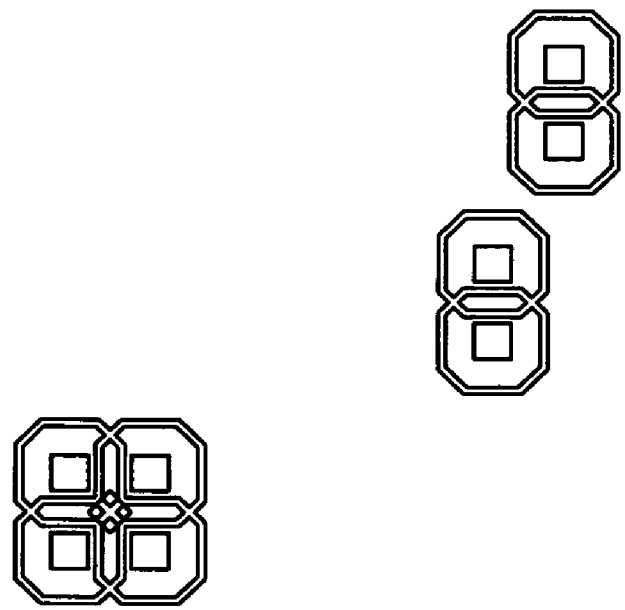
Figure 4C:
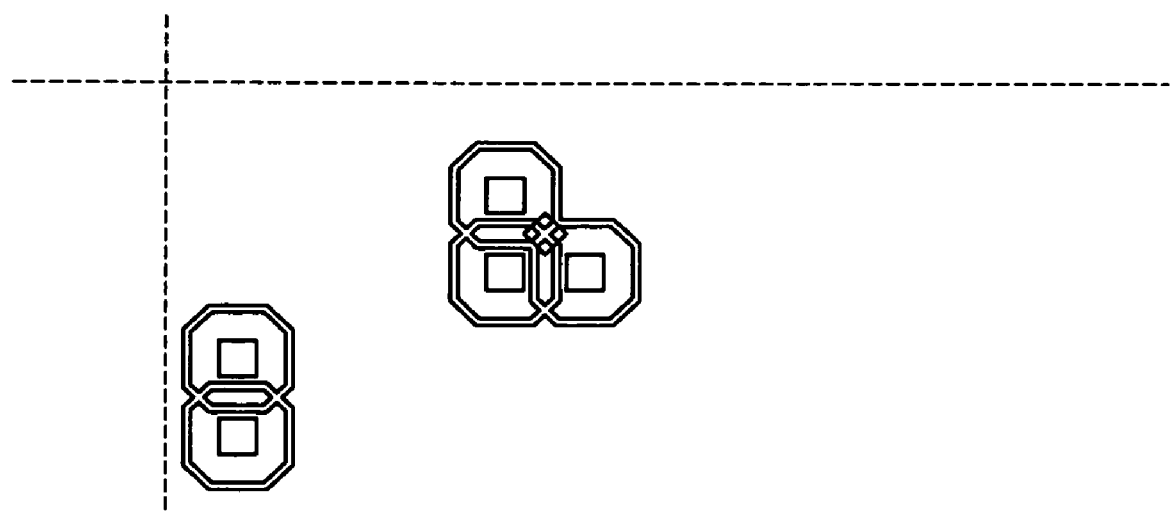
Figure 4D:
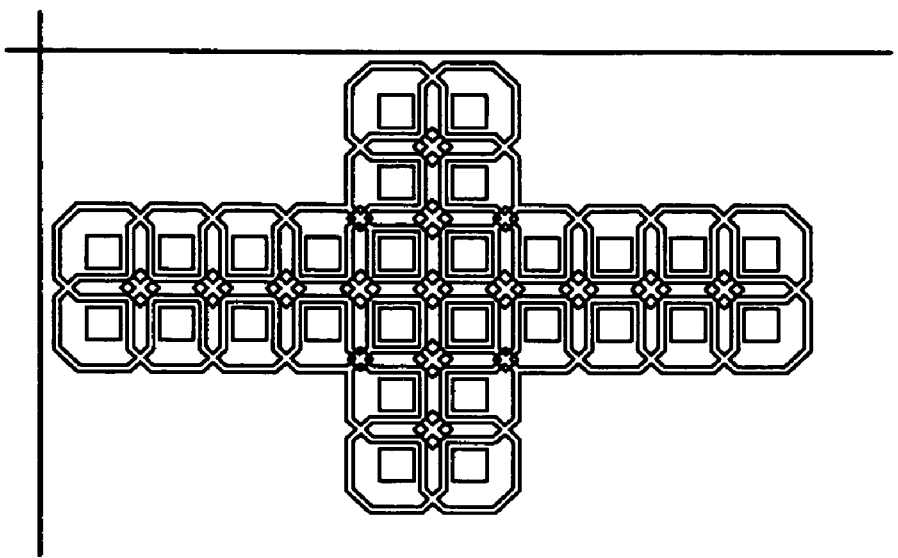

FIGS. 4A-4D illustrate other side lobe cases found in the layout for sample 5175 VIA. In FIG. 4A, a side lobe was found between four contacts bunched tightly together. Similarly, in FIG. 4B, a side lobe was found between four contacts in a remote area on the chip. In FIG. 4C, a smaller side lobe was found at the intersection of three side lobe radii in another remote area on the chip. In FIG. 4D, a plethora of side lobes was found in a contact array in the form of a cross. Larger side lobes were found where four side lobe radii intersected each other, and smaller side lobes were found where the intersecting radii numbered only three. FIG. 4D is another example of a configuration with side lobes which could potentially ruin a wafer batch.

Figure 5A:
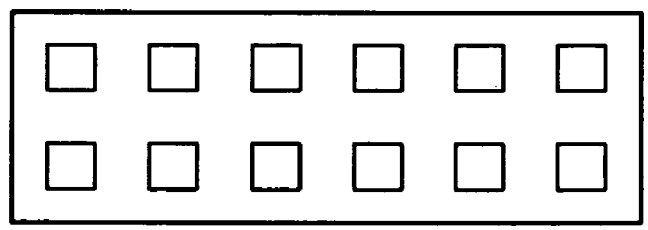
FIGS. 5A and 5B show how error flags appear in a chip layout in accordance with a preferred embodiment of the present invention.
Figure 5B:
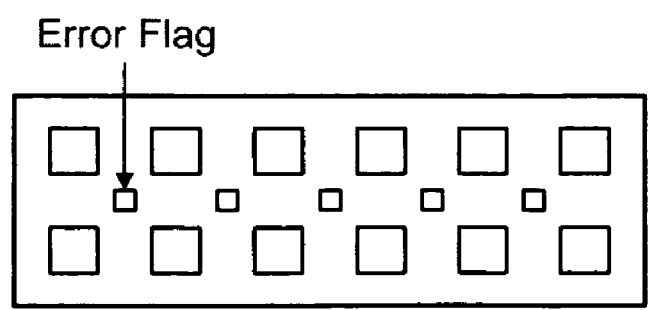

Upon detection of the side lobes in the layout, they must be eliminated, or at least significantly reduced, in order to form a properly functioning wafer. FIG. 5A shows an original layout which is subject to side lobe inspection. In preferred embodiments of the present invention, error flags mark the location of the detected side lobes. After using the method described above, FIG. 5B shows the layout, which is now marked with error flags in accordance with the LRC result. Here, as in FIG. 3B, the main pattern is a two row array of contacts, with side lobes present diagonally between four contacts. One way to eliminate the side lobe intensity is to automatically merge the error flag locations with the main pattern on the mask. This may be done by having the LRC software print out a new pattern containing the error flags, for example.

Figure 6:
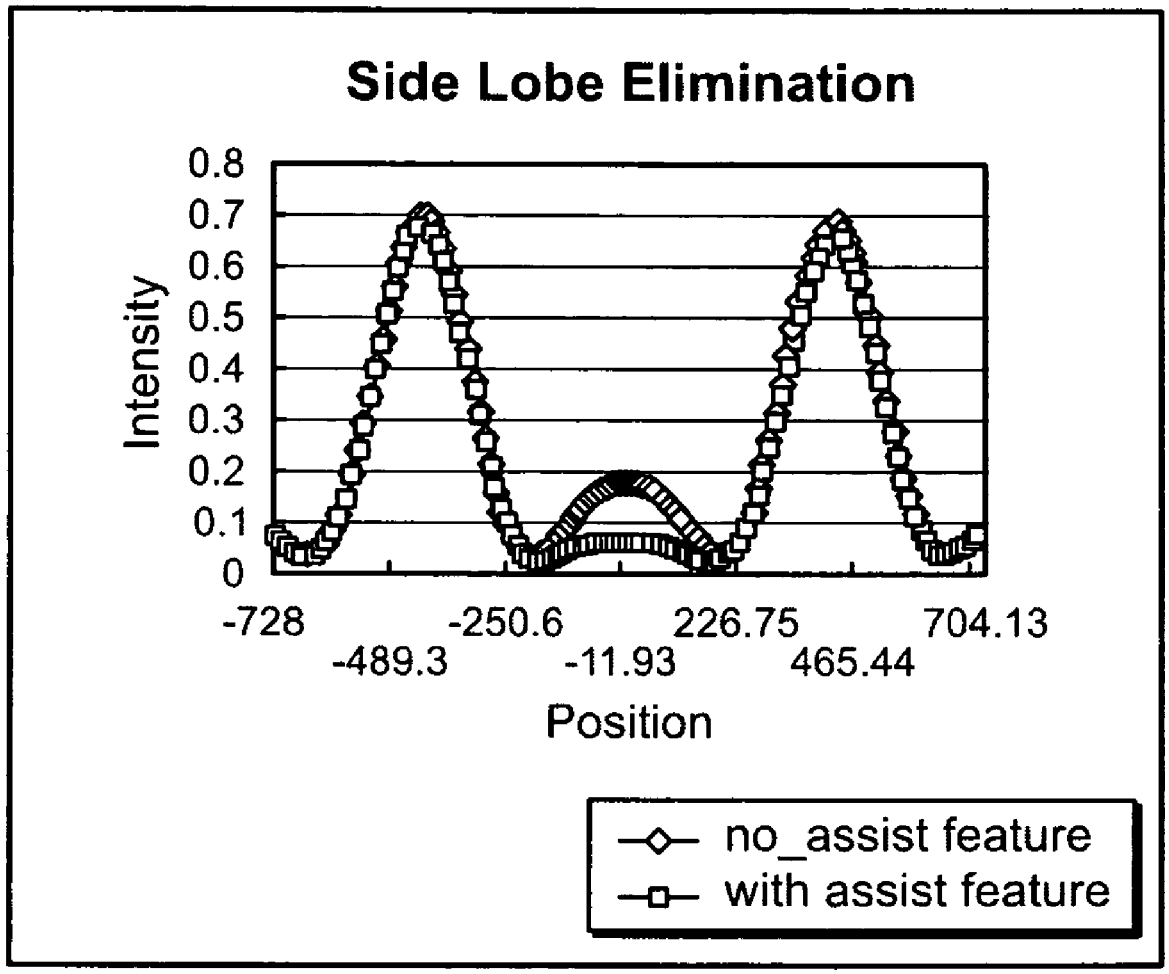
FIG. 6 shows a plot of intensity vs. position on the photoresist material for side lobe elimination programs both using and not using a preferred embodiment of the present invention.

FIG. 6 is a plot of intensity vs. position on the photoresist material. The two peaks of about 0.7 intensity, centered near −489.3 and 465.44 respectively on the x-axis, represent the intended contacts printed on the resist layer. Between them a side lobe was detected by both a conventional method and a method using the assist feature of the octagon pattern. The results of the elimination are reproduced. A significant side lobe intensity approaching 0.2 remained despite elimination attempts following the conventional detection process. Undertaking a method in accordance with an embodiment of the present invention produces a more desirable result. The side lobe intensity is lessened to a level of less than 0.1, eliciting a much flatter curve between the two peaks.

By using the conventional LRC for the method in accordance with embodiments of the present invention described above, a higher wafer yield is thus achieved without extra investment in additional software.

The method depicted in the drawings and described above used polygons, specifically octagons, for side lobe detection. However, the scope of the invention includes the use of other polygons. For example, the polygons may have 16 sides (hexadecagon) or 32 sides (dotriacontagon). Additionally, the scope of the invention further includes circles or rings substituted in place of the polygons.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. A method for detecting the presence of side lobes in a full chip layout having a main pattern, the method comprising:
    (a) using a computer to surround the main pattern with a pattern of polygons; and
    (b) using the computer to perform a lithography rule check, the lithography rule check including using the pattern of polygons to search out the intersected polygons in the pattern of polygons in order to find out areas for side lobe development.

2. The method of claim 1, wherein the polygons are one of octagons, hexadecagons, and dotriacontagons.

3. The method of claim 2, wherein the polygons are octagons.

4. The method of claim 2, wherein the polygons are hexadecagons.

5. The method of claim 2, wherein the polygons are dotriacontagons.

6. The method of claim 1, further comprising:
    (c) using the computer to make the location of a side lobe with an error flag.

* * * * *